US008350649B2

(12) United States Patent
Weirowski-Herz et al.

(10) Patent No.: US 8,350,649 B2
(45) Date of Patent: Jan. 8, 2013

(54) ELECTRONIC PLUNGER SWITCH

(75) Inventors: Achim Weirowski-Herz, Nagold (DE); Karl Steimle, Neubulach (DE); Roland Hengstler, Rottenburg (DE)

(73) Assignee: Kissling Electrotechnik GmbH, Wildberg (DE)

( * ) Notice: Subject to any disclaimer, the term of this patent is extended or adjusted under 35 U.S.C. 154(b) by 0 days.

(21) Appl. No.: 13/186,600

(22) Filed: Jul. 20, 2011

(65) Prior Publication Data

US 2012/0025936 A1 Feb. 2, 2012

(30) Foreign Application Priority Data

Jul. 31, 2010 (DE) ......................... 10 2010 033 014

(51) Int. Cl.
*H01L 43/04* (2006.01)
*H01H 9/00* (2006.01)

(52) U.S. Cl. ...................................... 335/205; 338/32 H

(58) Field of Classification Search .......... 335/205–207; 338/32 R, 32 H
See application file for complete search history.

(56) References Cited

U.S. PATENT DOCUMENTS 3,342,959 A * 9/1967 Breunich .................... 200/83 L
4,336,517 A * 6/1982 Kobayashi et al. ........... 335/205
4,476,359 A 10/1984 Bienwald
4,481,806 A 11/1984 Schad
4,638,276 A 1/1987 Hauk
7,893,800 B2 2/2011 Shimizu et al.
2003/0226749 A1 12/2003 Asa
2007/0290642 A1 12/2007 Shimizu et al.
2008/0258853 A1 10/2008 Yamada et al.
2009/0127080 A1 5/2009 Watada et al.
2009/0272607 A1 11/2009 Fischer et al.

FOREIGN PATENT DOCUMENTS

DE 1 959 469 6/1971
DE 10 2007 026 363 12/2007
DE 10 2006 053 183 5/2008
DE 10 2007 017 561 10/2008
DE 20 2010 010 918 11/2010
EP 1 710 821 10/2006
JP 59-41929 3/1984
JP 2000-173424 6/2000

* cited by examiner

*Primary Examiner* — Ramon Barrera
(74) *Attorney, Agent, or Firm* — Michael J. Striker

(57) ABSTRACT

A plunger switch for use as a switch element in an electrical circuit, has a housing and a plunger movable axially in a bore of the housing in the direction of a longitudinal axis and when in an operating position in which it is depressed toward the housing, acts on an electronic sensor unit situated in the housing, which in turn initiates a switching procedure in the electrical circuit by electrical pulses, and the plunger, in its axial plunging region into the bore of the housing, is peripherally provided with at least one lubricating groove, which permits a lubricating fluid to travel into the axial plunging region between the plunger and bore, and the electronic sensor unit is protected from a penetration of lubricating fluid.

9 Claims, 4 Drawing Sheets

ELECTRONIC PLUNGER SWITCH

CROSS-REFERENCE TO RELATED APPLICATION

The invention described and claimed hereinbelow is also described in German Patent Application DE 10 2010 033 014.0 filed on Jul. 31, 2010. This German Patent Application, whose subject matter is incorporated here by reference, provides the basis for a claim of priority of invention under 35 U.S.C. 119(a)-(d).

BACKGROUND OF THE INVENTION

The invention relates to a plunger switch for use as a switch element in an electrical circuit, having a housing and a plunger that is able to move axially in a bore of the housing in the direction of a longitudinal axis and when in an operating position in which it is depressed toward the housing, acts on an electronic sensor unit situated in the housing, which in turn initiates a switching procedure in the electrical circuit by means of electrical pulses.

A plunger switch of this kind is known, for example, from EP 1 710 821 A1 or US 2007/0290642 A1.

U.S. Pat. No. 4,481,806 A describes a plunger switch that acts on an inductive proximity switch with an oscillating electromagnetic field, which is interrupted in order to initiate a switching procedure by means of a metal pin.

U.S. Pat. No. 4,476,359 A discloses a push-button with a helical compression spring for mechanically driving a switch element.

Plunger switches are generally used to initiate switching procedures in electrical circuits by means of mechanical actuation of the plunger, in particular in order to close and/or open electrical switching contacts, which then in turn can trigger control operations in a larger system of which it is a part.

The vast majority of plunger switches currently available on the market are still based on a purely mechanical contact actuation of the type described, for example, in US 2008/0258853 A1. The plunger switches disclosed in US 2009/0127080 A1 or U.S. Pat. No. 4,638,276 A likewise have mechanical contact elements and each feature a lubrication of the plunger.

As discussed at the beginning, however, electronic plunger switches are also already available in which only the triggering of the switching procedure is produced by the mechanical movement of the plunger; the actual physical opening and closing of electrical contacts is carried out by means of a sensor unit that reacts to the plunger movement and can be embodied in a wide variety of ways. It is thus possible to simply detect axial on/off positions of the plunger without requiring special adaptation or design of the plunger and electrical contacts with regard to closing force and the like. In addition, this permits an automated electronic state diagnosis or function check of the plunger switch to be carried out in a simple way. Frequently, switches of this kind are also used in vehicle transmissions for detecting the current shifting state.

As before, though, even when using electronic sensor units in plunger switches, because of the necessary mechanical action of the plunger, which does in fact have to be actuated either automatically by moving machine parts or manually by an operator, the best that can be achieved is a switching capacity of at most 1 million actuations over the service life of the plunger switch. After this, at the very least, the mechanical part of the switch is worn out and as a rule, the entire plunger switch must be replaced.

In the plunger switch described in the above-mentioned US 2009/0127080 A1, whose plunger acts on a purely mechanical switch element, in order to separate an actuating chamber from a contact chamber, a diaphragm and other moving parts are provided, which result in high friction-induced actuation forces at various temperatures. Experience has shown that such an apparatus can malfunction after a few hundred thousand actuations.

SUMMARY OF THE INVENTION

By contrast with this prior art, the object of the present invention is to create, using the simplest technical means and in the most uncomplicated, inexpensive way, a plunger switch of the type described at the beginning, which is equipped with an electronic sensor unit and despite the use of moving mechanical parts, makes it possible to significantly increase the number of cycles to a figure greater than 4 million actuations over the service life of the plunger switch.

This object is attained according to the invention in a way that is as surprisingly simple as it is effective in that the plunger, in its axial plunging region into the bore of the housing, is peripherally provided with at least one lubricating groove, which permits a lubricating fluid to travel into the axial plunging region between the plunger and bore, and in that the electronic sensor unit has means for protecting it from a penetration of lubricating fluid.

By means of the self-lubrication of the plunger and bore provided according to the invention, in connection with the electronic signal pick-up, which avoids a direct introduction of force from the mechanically actuated plunger to the actual electric switch of the apparatus, it is easily possible to achieve a number of cycles greater than 4 million actuations over the service life of the plunger switch. However, this is only possible through the cooperation according to the invention with the means for protecting the electronic sensor unit from the penetration of lubricating fluid because otherwise, the service life of the plunger switch would be drastically reduced again by damage to the sensor unit since even with the selection of a nonaggressive lubricating fluid, it is almost impossible to ensure that continuous contact of the electronic components with the lubricant will not result in damage at some point in time.

Frequently, switches of this kind are used in vehicle transmissions for detecting the current shifting state. In these cases, transmission fluid, an abundance of which is present anyway in the region in which the plunger switch is employed, can be used as a lubricating fluid.

In the plunger switch according to the invention, the geometry—in particular the external dimensions—and the electrical compatibility with subsequent units can be embodied identically to conventional switches in order to ensure trouble-free interchangeability.

According to a particularly preferred embodiment of the plunger switch according to the invention, the means for protecting the electronic sensor unit from a penetration of lubricating fluid includes a mechanical cover of the sensor unit. In simple modifications, this mechanical cover can be implemented, for example, by providing a fluid-tight dividing wall in the housing between the penetration region of the lubricating fluid and the electronic sensor unit.

There are also advantageous embodiments in which—in addition or alternatively—the electronic sensor unit and possibly other electronic components situated in the housing is/are encapsulated in a plastic, in particular a hardening one, in order to protect them from a penetration of lubricating fluid, on the one hand permitting a simple, inexpensive manufacture and on the other hand, offering 100% protection of the correspondingly encapsulated electronic components. In addition, the encapsulation also protects the electronics from a penetration of and possibly damaging attack by other media, for example protecting them from contamination with dust, which is present everywhere.

In a preferred class of embodiments of the plunger switch according to the invention, the lubrication groove extends in helical form around the longitudinal axis of the plunger, which, due to the fact that the lubrication groove is situated so that it extends past the plunger in the axial direction from top to bottom, assures an optimal, automatic, and uniform permanent lubrication between the plunger and bore as well as a high percentage of contact area of the guide surfaces in the plunger guidance. Lubricating fluid travels inward when the plunger is actuated in the direction toward the housing interior and can travel at least part-way back out again with the plunger returns.

Particularly advantageous modifications of this class of embodiments are distinguished by the fact that at least two—but possibly also more—lubrication grooves are provided, which extend helically around the longitudinal axis of the plunger in the form of a double helix, making it possible to further increase the lubricating properties of the apparatus and thus to extend the maximum service life of the plunger switch according to the invention.

Alternatively, in another class of embodiments of the plunger switch according to the invention that are simpler and less expensive to manufacture, one or more lubricating grooves extend in a ring-shaped fashion around the longitudinal axis of the plunger. This significantly reduces the supply of lubricating fluid into the housing as compared to the helical geometry. As a rule, however, even small quantities of lubricant in the region between the plunger and bore are enough to assure a sufficient permanent lubrication. A certain amount of lubricating fluid that has traveled inward with the actuation of the plunger can be transported back out of the housing with the return travel of the plunger so that the housing interior does not become “flooded” with fluid.

In a particularly preferable class of embodiments of the plunger switch according to the invention, the electronic sensor unit includes a Hall sensor whose magnetic field lines can preferably be at least partially shielded toward the outside.

Simple-to-implement modifications of this class of embodiments are distinguished by the fact that the magnetic shielding of the Hall sensor includes a shielding tube or a shielding foil that is composed of magnetically conductive material.

Modifications of this class of embodiments that have proven themselves in actual practice are those in which the Hall sensor is mounted in stationary fashion relative to the housing and the magnetic shielding is situated so that it is able to move along with the plunger relative to the housing, thus making it possible to implement particularly favorable operating sequences in the actuation of the plunger switch according to the invention. Due to the rigid, stationary mounting of the Hall sensor and associated magnet, these sensitive components are not subjected to any mechanical actuation and are optimally protected from damage, which extends the maximum service life of the plunger switch according to the invention. The switch actuation in this case is achieved through the mobile mounting of the magnetic shield relative to the sensor.

In embodiments of the plunger switch according to the invention that are particularly easy to operate and simple to manufacture, the housing is composed of two parts and between the top part and bottom part of the housing, a sealing element such as a sealing ring is provided, which prevents an escape of lubricating fluid from the housing.

A preferred class of modifications of these embodiments in connection with the embodiment described further above—in which the means for protecting the electronic sensor unit from a penetration of lubricating fluid includes a mechanical cover of the sensor unit—is distinguished by the fact that the mechanical cover is embodied in the shape of a cup and at the cup edges, is sealed in a fluid-tight fashion against the lower part of the housing by means of one or more sealing elements.

In an advantageous geometric variant of these modifications, the mechanical cover can be embodied in the shape of a Bundt cake whose chimney-like, hollow cylindrical central region permits a compression spring abutting the plunger to extend through it in the assembled state of the plunger switch.

Finally, a particularly effective protection of the sensitive electronic sensor unit is ensured by a variant in which, at its radially outer annular rim, the mechanical cover is sealed in a fluid-tight fashion against the upper part and lower part of the housing by means of a first sealing ring and at the radially inner annular rim of its chimney-like, hollow cylindrical central region, the mechanical cover is sealed in a fluid-tight fashion against the lower part of the housing by means of an additional sealing ring.

Advantageous features and advantages of the invention ensue from the following detailed description of exemplary embodiments of the invention in conjunction with the drawings, which show details essential to the invention, and also ensue from the claims. The individual features can be embodied separately in and of themselves, or united into any number of combinations in variants of the invention.

BRIEF DESCRIPTION OF THE DRAWINGS

Exemplary embodiments of the invention are schematically depicted in the drawings and explained in greater detail in the description that follows.

DESCRIPTION OF THE PREFERRED EMBODIMENTS

Figure 1:
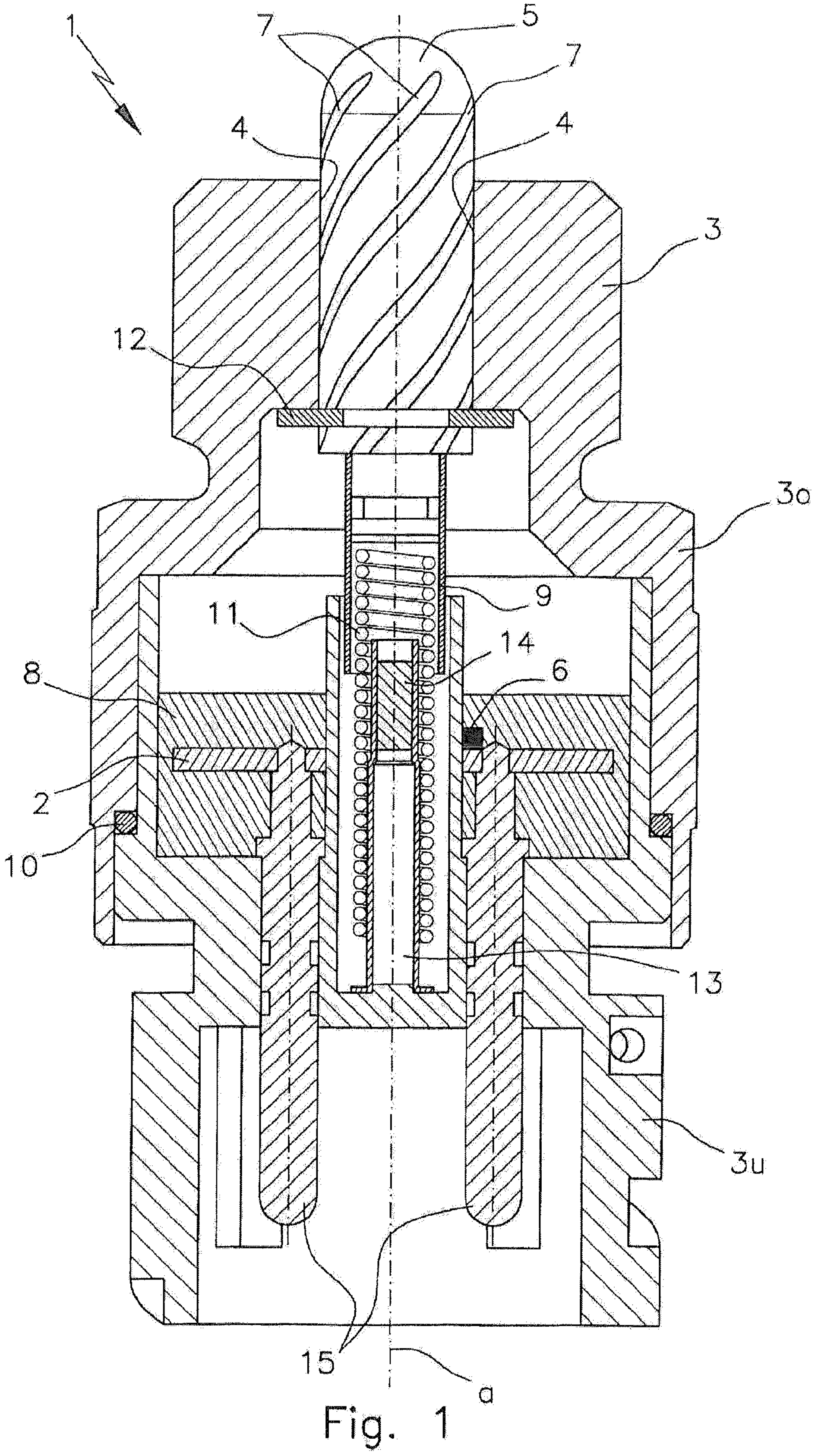
FIG. 1 shows a preferred embodiment of the plunger switch according to the invention in a schematic vertical section, with a plastic encapsulation around the electrical circuit and the electronic sensor unit.
Figure 2A:
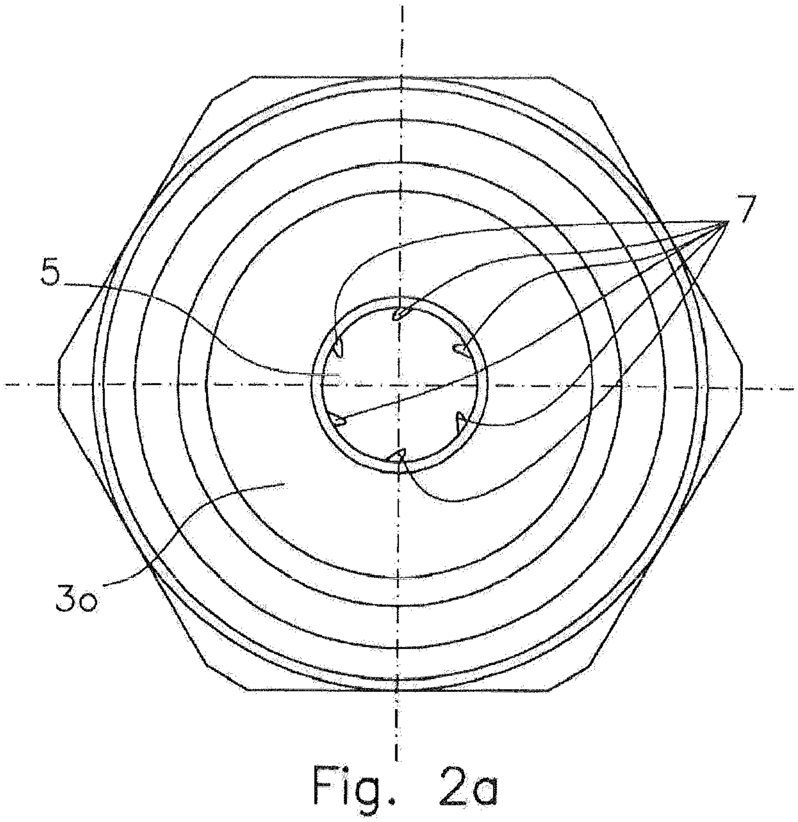
FIG. 2*a* is a detailed view of the embodiment from FIG. 1, in an axial view of the plunger from above.
Figure 2B:
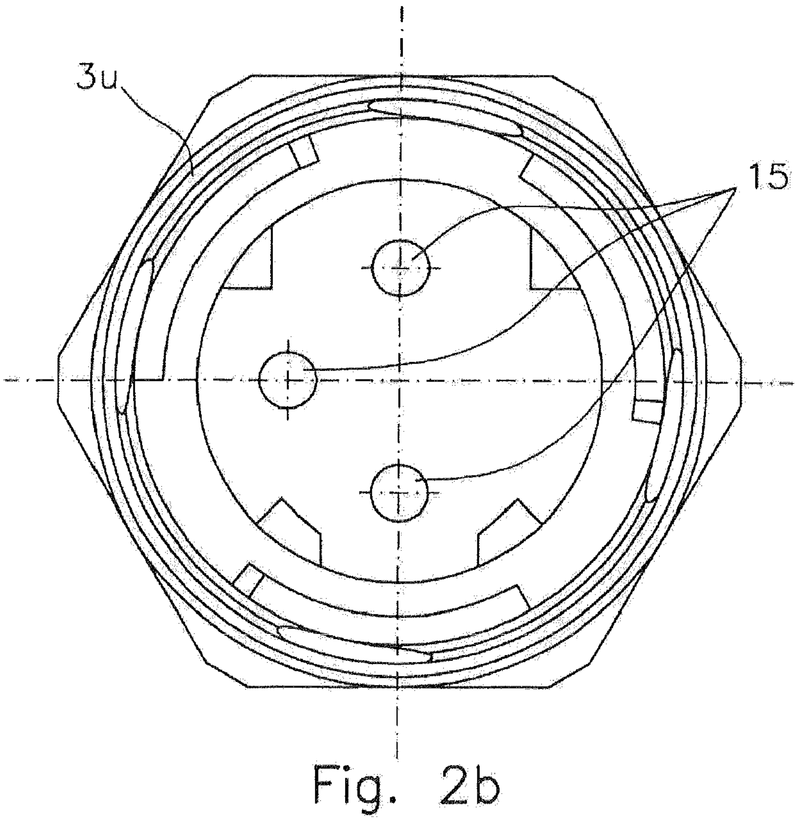
FIG. 2*b* is a detailed view of the embodiment from FIG. 1, in an axial view from below, showing the connecting pins of the plunger switch.
Figure 3:
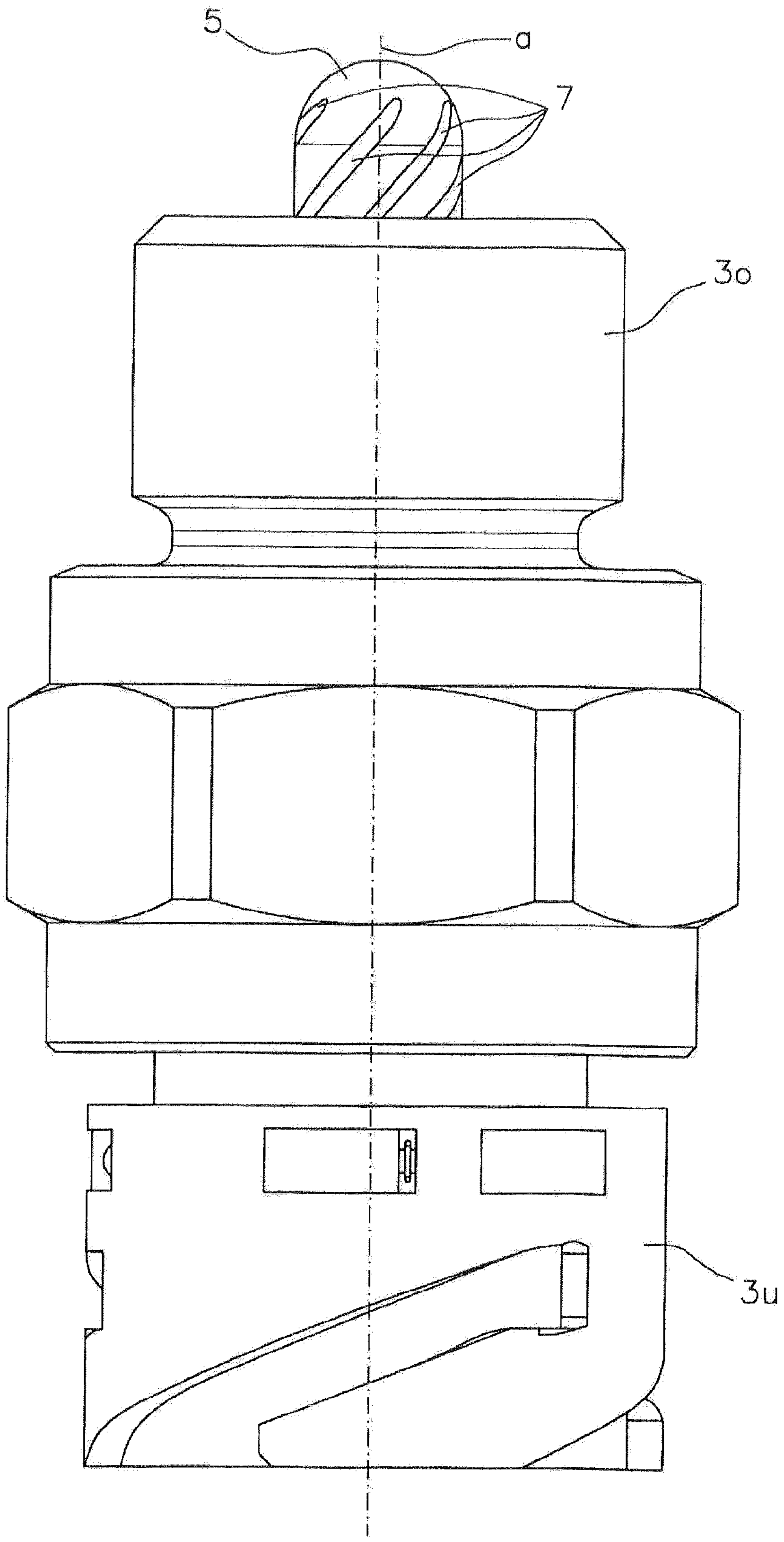
FIG. 3 is an enlarged detailed view of the embodiment from FIG. 1, in a radial view from the side, showing the switch head with the plunger.

The exemplary embodiments of the plunger switch 1; 1' according to the invention—which are depicted both schematically and in detail in the figures and show a plunger switch for use as a switch element in an electrical circuit 2—have a housing 3; 3' and a plunger 5 that is able to move axially in a bore 4 of the housing 3; 3' in the direction of a longitudinal axis a and when in an operating position in which it is depressed toward the housing 3; 3', acts on an electronic sensor unit 6; 6' situated in the housing 3; 3', which in turn initiates a switching procedure in the electrical circuit 2 by means of electrical pulses.

According to the invention, the plunger switch 1; 1' is distinguished from conventional switches by the fact that the plunger 5, in its axial plunging region into the bore 4 of the housing 3; 3', is peripherally provided with at least one lubricating groove 7, which permits a lubricating fluid to travel into the axial plunging region between the plunger 5 and bore 4, and in that the electronic sensor unit 6; 6' has means 8; 8' for protecting it from a penetration of lubricating fluid, which can in particular include a mechanical cover of the sensor unit 6; 6'.

In the exemplary embodiment shown in FIG. 1, a means 8 for protecting the electronic sensor unit 6 from the penetration of lubricating fluid is provided through encapsulation with a hardening plastic.

Figure 4:
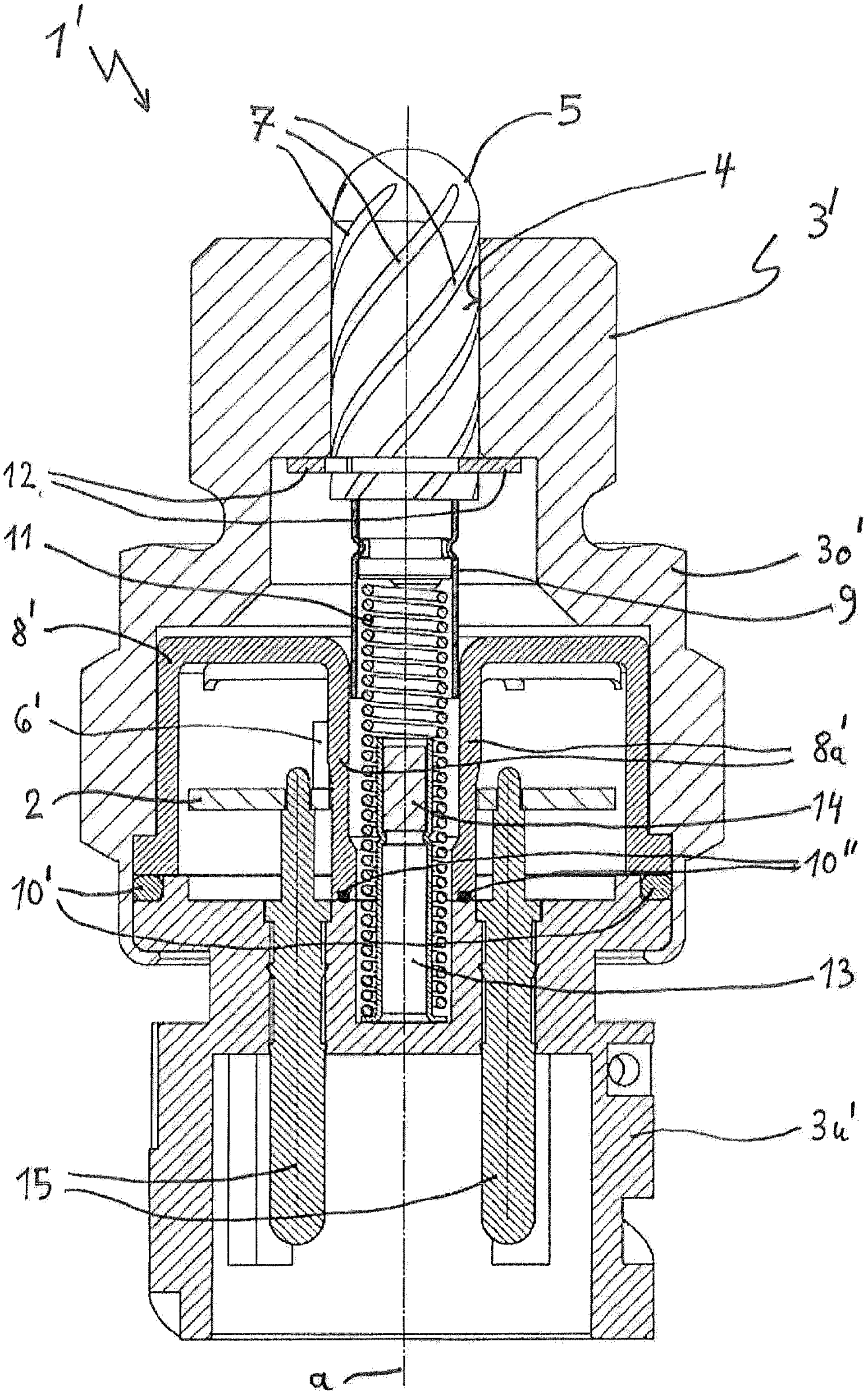
FIG. 4 shows another embodiment of the plunger switch according to the invention, with a cup-shaped mechanical cover of the sensor unit.

By contrast, FIG. 4 shows an embodiment of the invention in which the mechanical cover 8' is embodied in the form of a cup that is shaped like a Bundt cake whose chimney-like, hollow cylindrical central region **8*a*' permits a compression spring 11 abutting the plunger 5 to extend through it in the assembled state of the plunger switch 1'**.

A plurality of lubricating grooves 7—a total of six grooves in the exemplary embodiment shown, as can be seen in FIG. **2*a*—extend helically in the form of a twisted multiple helix around the longitudinal axis a of the plunger 5. It is naturally also possible to provide only a single lubricating groove 7**.

Alternatively—in embodiments of the invention likewise not specifically depicted in the drawings—it is also possible to provide only a single, or several, lubrication groove(s) 7 extending in a ring-shaped fashion around the longitudinal axis a of the plunger 5.

In the embodiments shown, the electronic sensor unit 6; 6' includes a Hall sensor whose magnetic field lines are at least partially shielded toward the outside by means of a shielding tube 9. It is also possible, however, to provide a magnetic shielding of the Hall sensor by means of a shielding foil that is composed of magnetically conductive material. The Hall sensor is mounted in stationary fashion relative to the housing 3; 3' and the magnetic shielding is situated so that it is able to move along with the plunger 3 relative to the housing 3; 3'.

In the exemplary embodiments shown, the housing 3; 3' is composed of two parts and between the top part **3*o*; 3*o*' and bottom part 3*u*; 3*u*' of the housing 3; 3', a first sealing element 10; 10' is provided, which prevents an escape of lubricating fluid from the housing 3; 3'**.

In the embodiment according to FIG. 4, at the radially inner annular rim of its chimney-like, hollow cylindrical central region **8*a*', the mechanical cover 8' is additionally sealed in a fluid-tight fashion against the lower part 3*u*' of the housing 3' by means of an additional sealing ring 10"**.

The external operation of the plunger switch 1; 1' according to the invention is essentially the same as that of conventional switches: the compression spring 11 and a securing ring 12 on the housing side of the lower end of the bore 2 hold the plunger 5 in its home position.

In this home position, the Hall sensor of the sensor unit 6; 6' is pre-actuated by the magnetic field lines of a permanent magnet 14 mounted on a magnet holder 13. As soon as the plunger 5 is moved along the longitudinal axis a in the direction toward the housing interior, a bundling of magnetic field lines occurs by means of the shielding tube 9, which in turn interrupts the actuation of the Hall sensor. Its switching signal is then processed by the electrical circuit 2.

Depending on the output signal of the electrical circuit 2, which is picked up by connecting pins 15 in the exemplary embodiment shown, it is then possible—for example by means of an external control unit not specifically depicted in the drawing—for the operating state of the plunger switch 1; 1' to be detected as "not actuated" in the above-described home position or detected as "actuated" in the position with the depressed plunger 5, then evaluated in accordance with the existing operating programs, and finally converted into predetermined control signals.

It will be understood that each of the elements described above, or two or more together, may also find a useful application in other types of constructions differing from the types described above.

While the invention has been illustrated and described as embodied in an electronic plunger switch, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

The invention claimed is:

1. A plunger switch for use as a switch element in an electrical circuit, comprising a housing and a plunger that is able to move axially in a bore of the housing in a direction of a longitudinal axis and when in an operating position in which it is depressed toward the housing, acts on an electronic sensor unit situated in the housing, which in turn initiates a switching procedure in the electrical circuit by electrical pulses, wherein the plunger, in its axial plunging region into a bore of the housing, is peripherally provided with at least two lubricating grooves, wherein the lubricating grooves permit a lubricating fluid to travel into the axial plunging region between the plunger and bore, wherein the electronic sensor unit has means for protecting the electronic sensor unit from a penetration of lubricating fluid, and wherein the at least two lubrication grooves extend around the longitudinal axis of the plunger in form of a double helix.

2. The plunger switch as recited in claim 1, wherein the means for preventing the electronic sensor unit from a penetration of lubricating fluid encapsulate the electronic sensor unit in plastic.

3. The plunger switch as recited in claim 2, wherein the plastic which encapsulates the electronic sensor unit is a hardening plastic.

4. The plunger switch as recited in claim 2, wherein the means for preventing encapsulates electronic components situated in the housing that are not part of the electronic sensor unit.

5. A plunger switch for use as a switch element in an electrical circuit, comprising a housing and a plunger that is able to move axially in a bore of the housing in a direction of a longitudinal axis and when in an operating position in which it is depressed toward the housing, acts on an electronic sensor unit situated in the housing, which in turn initiates a switching procedure in the electrical circuit by electrical pulses, wherein the plunger, in its axial plunging region into a bore of the housing, is peripherally provided with at least one lubricating groove, wherein the at least one lubricating groove permits a lubricating fluid to travel into the axial plunging region between the plunger and bore, and wherein the electronic sensor unit has means for protecting the electronic sensor unit from a penetration of lubricating fluid and wherein the electronic sensor unit includes a Hall sensor whose magnetic field lines are at least partially shielded toward an outside.

6. The plunger switch as recited in claim 5, wherein a magnetic shielding of the Hall sensor includes a shielding element selected from the group consisting of a shielding tube and a shielding foil and composed of magnetically conductive material.

7. The plunger switch as recited in claim 5, wherein the Hall sensor is mounted in stationary fashion relative to the housing and the magnetic shielding is situated so that it is movable along with the plunger relative to the housing.

8. A plunger switch for use as a switch element in an electrical circuit, comprising a housing and a plunger that is able to move axially in a bore of the housing in a direction of a longitudinal axis and when in an operating position in which it is depressed toward the housing, acts on an electronic sensor unit situated in the housing, which in turn initiates a switching procedure in the electrical circuit by electrical pulses, wherein the plunger, in its axial plunging region into a bore of the housing, is peripherally provided with at least one lubricating groove that permits a lubricating fluid to travel into the axial plunging region between the plunger and bore, wherein the electronic sensor unit has means for protecting it from a penetration of lubricating fluid, wherein the housing is composed of two parts including a top part and a bottom part, and between the top part and bottom part of the housing, a sealing element is provided to prevent an escape of lubricating fluid from the housing, wherein the means for protecting the electronic sensor unit from a penetration of lubricating fluid includes a mechanical cover of the sensor unit, and wherein the mechanical cover of the sensor unit:

is shaped as a Bundt cake, at the Bundt cake edges is sealed in a fluid-tight fashion against the bottom part of the housing by at least one sealing element, and includes a chimney-like, hollow cylindrical central region that permits a compression spring abutting the plunger to extend through the hollow cylindrical central region in an assembled state of the plunger switch.

9. The plunger switch as recited in claim 8, wherein at its radially outer annular rim, the mechanical cover is sealed in a fluid-tight fashion against the top part and bottom part of the housing by a first sealing ring and at a radially inner annular rim of its chimney-like, hollow cylindrical central region, the mechanical cover is sealed in a fluid-tight fashion against the bottom part of the housing by an additional sealing ring.

* * * * *